US012009441B2

(12) United States Patent
Rim et al.

(10) Patent No.: US 12,009,441 B2
(45) Date of Patent: *Jun. 11, 2024

(54) SOLAR CELLS WITH DIFFERENTIATED P-TYPE AND N-TYPE REGION ARCHITECTURES

(71) Applicant: Maxeon Solar Pte. Ltd., Singapore (SG)

(72) Inventors: Seung Bum Rim, Palo Alto, CA (US); Michael C. Johnson, Alameda, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/099,802

(22) Filed: Jan. 20, 2023

(65) Prior Publication Data

US 2023/0155039 A1    May 18, 2023

Related U.S. Application Data

(63) Continuation of application No. 16/853,437, filed on Apr. 20, 2020, now Pat. No. 11,594,648, which is a
(Continued)

(51) Int. Cl.
*H01L 31/0216* (2014.01)
*H01L 31/0224* (2006.01)
(Continued)

(52) U.S. Cl.
CPC ......... *H01L 31/02168* (2013.01); *H01L 31/022441* (2013.01); *H01L 31/02363* (2013.01);
(Continued)

(58) Field of Classification Search
CPC .............. H01L 31/022441; H01L 31/0352
See application file for complete search history.

(56) References Cited

U.S. PATENT DOCUMENTS 9,312,406 B2    4/2016  Loscutoff et al.
9,564,551 B2    2/2017  Loscutoff et al.
(Continued)

FOREIGN PATENT DOCUMENTS

CN    104769725    7/2015
CN    105074874    11/2015
(Continued)

OTHER PUBLICATIONS

Smith et al., U.S. Appl. No. 15/089,382 entitled "Metallization of Solar Cells With Differentiated P-Type and N-Type Region Architectures" filed on Apr. 1, 2016, 46 pgs.
(Continued)

*Primary Examiner* — Angelo Trivisonno
(74) *Attorney, Agent, or Firm* — Schwabe, Williamson & Wyatt, P.C.

(57) ABSTRACT

Methods of fabricating solar cell emitter regions with differentiated P-type and N-type regions architectures, and resulting solar cells, are described. In an example, a solar cell can include a substrate having a light-receiving surface and a back surface. A first doped region of a first conductivity type, wherein the first doped region is disposed in a first portion of the back surface. A first thin dielectric layer disposed over the back surface of the substrate, where a portion of the first thin dielectric layer is disposed over the first doped region of the first conductivity type. A first semiconductor layer disposed over the first thin dielectric layer. A second doped region of a second conductivity type in the first semiconductor layer, where the second doped region is disposed over a second portion of the back surface. A first conductive contact disposed over the first doped
(Continued)

region and a second conductive contact disposed over the second doped region.

16 Claims, 4 Drawing Sheets

Related U.S. Application Data continuation of application No. 15/283,137, filed on Sep. 30, 2016, now Pat. No. 10,629,758.

(51) Int. Cl.
  *H01L 31/0236* (2006.01)
  *H01L 31/0352* (2006.01)
  *H01L 31/0747* (2012.01)

(52) U.S. Cl.
  CPC ...... *H01L 31/0352* (2013.01); *H01L 31/0747* (2013.01); *Y02E 10/50* (2013.01)

(56) References Cited

U.S. PATENT DOCUMENTS

| | | |
|---|---|---|
| 2011/0308591 A1 | 12/2011 | Yamazaki et al. |
| 2012/0305063 A1 | 12/2012 | Moslehi et al. |
| 2013/0164878 A1 | 6/2013 | Cousins et al. |
| 2014/0020752 A1 | 1/2014 | Arimoto et al. |
| 2014/0096821 A1 | 4/2014 | Chen et al. |
| 2014/0166093 A1 | 6/2014 | Loscutoff et al. |
| 2014/0174515 A1* | 6/2014 | Molesa ............... H01L 31/0682 136/255 |
| 2015/0144197 A1 | 5/2015 | Cousins et al. |
| 2015/0179838 A1* | 6/2015 | Rim .................... H01L 31/202 136/256 |
| 2015/0349158 A1 | 12/2015 | Manning |
| 2016/0043267 A1 | 2/2016 | Rim et al. |
| 2016/0204288 A1 | 7/2016 | Loscutoff et al. |

FOREIGN PATENT DOCUMENTS

| | | |
|---|---|---|
| CN | 105794004 | 7/2016 |
| JP | 2013/183160 | 9/2013 |
| KR | 10-2015-0100741 | 9/2015 |
| KR | 10-2016-0100957 | 8/2016 |

OTHER PUBLICATIONS

International Search Report and Written Opinion from PCT/US2017/052067 dated Dec. 15, 2017, 16 pgs.
First Action Interview Pilot Program Pre-Interview Communication from U.S. Appl. No. 15/283,137 dated Oct. 1, 2018, 9 pgs.
First Action Interview Office Action from U.S. Appl. No. 15/283,137 dated Dec. 10, 2018, 5 pgs.
International Preliminary Report on Patentability from PCT/US2017/052067 dated Apr. 11, 2019, 7 pgs.
Final Office Action from U.S. Appl. No. 15/283,137 dated Apr. 22, 2019, 14 pgs.
Non-Final Office Action from U.S. Appl. No. 15/283,137 dated Aug. 5, 2019, 14 pgs.
Office Action from German Patent Application No. 11 2017 004982.2 dated Feb. 25, 2021, 20 pgs.
Non-Final Office Action from U.S. Appl. No. 16/853,437 dated May 7, 2021, 21 pgs.
Final Office Action from U.S. Appl. No. 16/853,437 dated Nov. 16, 2021, 16 pgs.
First Office Action from Chinese Patent Application No. 201780060964.7 dated Apr. 8, 2022, 11 pgs.
Non-Final Office Action from U.S. Appl. No. 16/853,437 dated May 25, 2022, 16 pgs.
Notification of Provisional Rejection from Korean Patent Application No. 10-2019-7011820 dated Aug. 16, 2022, 13 pgs.
Second Office Action from Chinese Patent Application No. 201780060964.7 dated Nov. 8, 2022, 8 pgs.
Office Action from German Patent Application No. 11 2017 004 982.2 dated Sep. 6, 2023, 7 pgs.

\* cited by examiner

SOLAR CELLS WITH DIFFERENTIATED P-TYPE AND N-TYPE REGION ARCHITECTURES

CROSS-REFERENCE TO RELATED APPLICATIONS

This application is a continuation of U.S. patent application Ser. No. 16/853,437, filed on Apr. 20, 2020, which is a continuation of U.S. patent application Ser. No. 15/283,137, filed on Sep. 30, 2016, now U.S. Pat. No. 10,629,758, issued on Apr. 21, 2020, the entire contents of which are hereby incorporated by reference herein.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1:
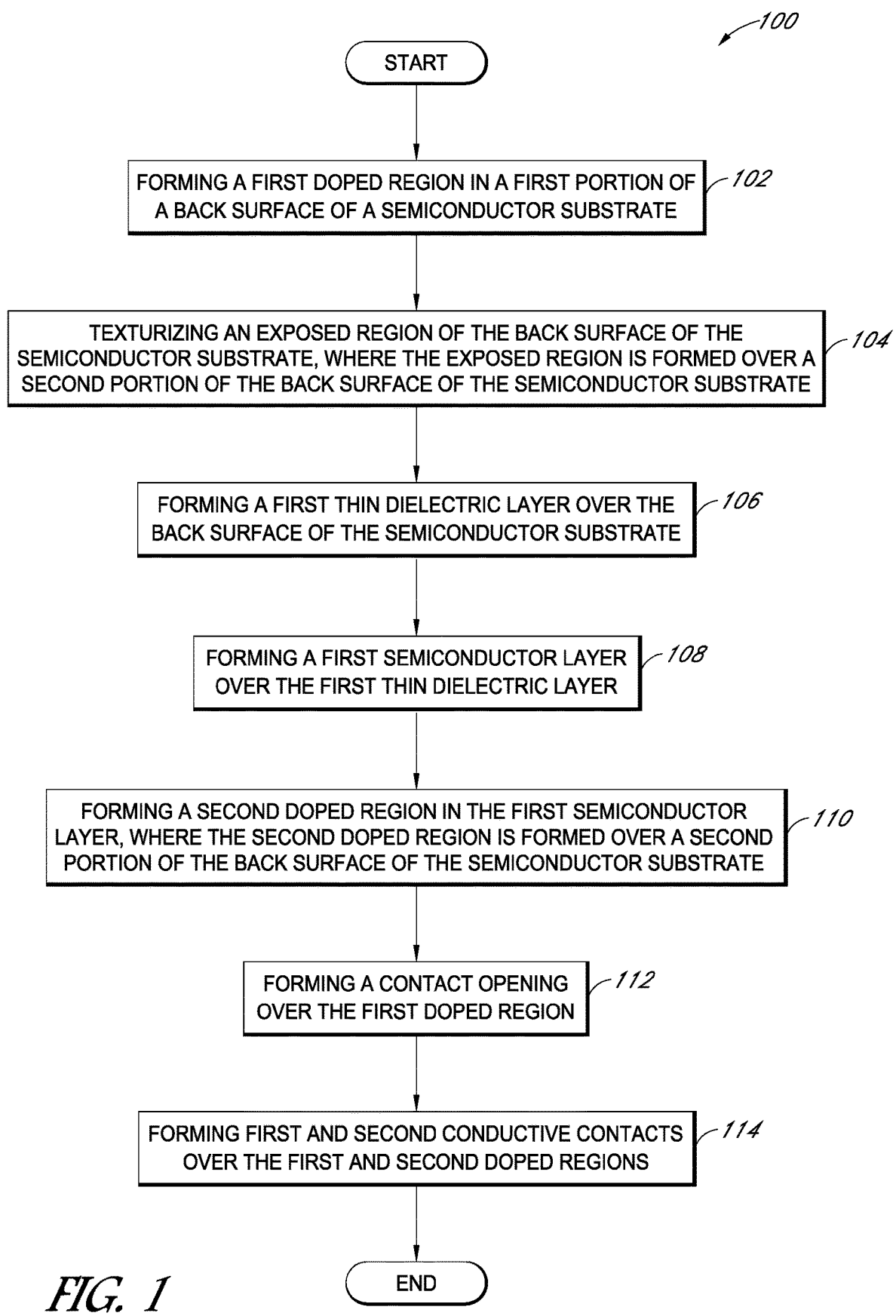
FIG. 1 is a flowchart listing operations in a method of fabricating a solar cell corresponding to FIGS. 2-10, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" doped region does not necessarily imply that this doped region in a sequence; instead the term "first" is used to differentiate this doped region from another doped region of solar cell (e.g., a "second" second doped region). In one example, a first doped region can be a P-type doped region and the second doped region can be a N-type doped region. In some examples, the first doped region can be disposed in a portion of a semiconductor substrate (e.g., a silicon substrate of a solar cell). In one example, the second doped region can be disposed in a semiconductor layer (e.g., polycrystalline silicon layer, amorphous silicon layer, etc.) disposed above the semiconductor substrate.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

Methods of fabricating solar cell emitter regions with differentiated P-type and N-type region architectures, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a back contact solar cell includes a substrate having a light-receiving surface and a back surface. In an embodiment, a first doped region of a first conductivity type is disposed in a first portion of the back surface. In one embodiment, a first thin dielectric layer is disposed over the back surface of the substrate, where a portion of the first thin dielectric layer is disposed over the first doped region of the first conductivity type. In an embodiment, the first conductivity can be P-type or N-type. In an example, the first thin dielectric layer can be a tunnel oxide. In an embodiment, a first semiconductor layer is disposed over the first thin dielectric layer, where a portion of the first semiconductor layer is disposed over the first doped region of the first conductivity type. In one example, the first semiconductor layer can be a polycrystalline silicon layer. In an embodiment, a second doped region of a second conductivity type is disposed in the first semiconductor layer, wherein the second doped region is disposed over a second portion of the back surface. In one embodiment, a first conductive contact is disposed over the first doped region and a second conductive contact is disposed over the second doped region.

Turning now to FIG. 1, a flow chart 100 listing operations in a method of fabricating a solar cell 200 corresponding to FIGS. 2-10 is presented, according to some embodiments. In various embodiments, the method of FIG. 1 can include additional (or fewer) blocks than illustrated. For example, in some embodiments, an exposed region of the back surface of the semiconductor substrate, at block 104, need not be texturized.

Figure 2:
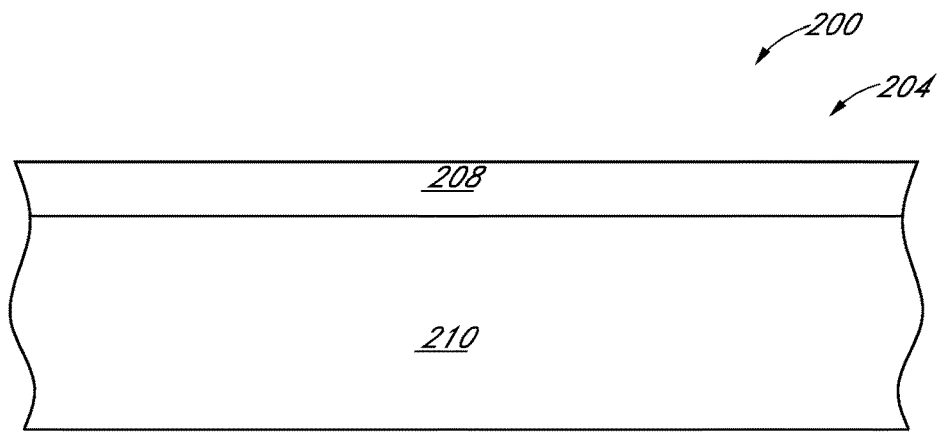
FIGS. 2-9 illustrate cross-sectional views of various stages in the fabrication of a solar cell, according to some embodiments.
Figure 3:
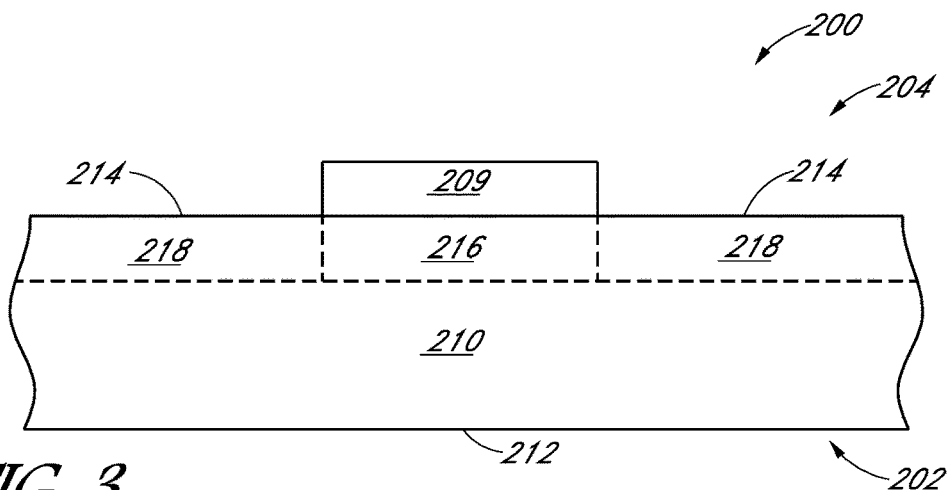
Figure 4:
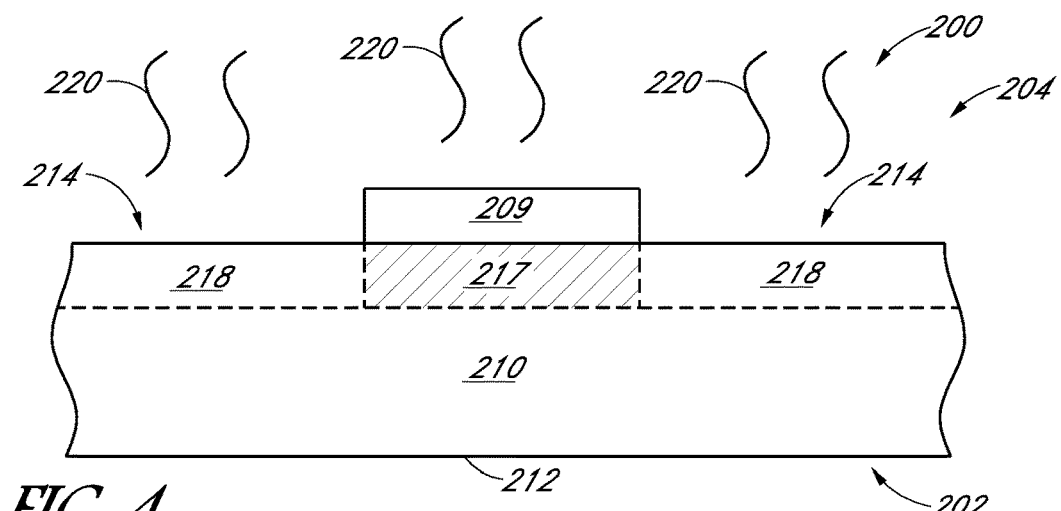

FIGS. 2-4 provide an example method of forming the first doped region in a first portion of the back surface of a semiconductor substrate corresponding to operation 102 of flowchart 100. Although, several steps in one method is presented in FIGS. 2-4, e.g., mask and etch process, is to be understood other methods can be used to form the first doped region.

Referring again to FIG. 2, a first dopant layer 208 can be formed over a semiconductor substrate 210, according to some embodiments.

With reference to FIG. 2, in an embodiment, the semiconductor substrate 210 can be a silicon substrate. In some embodiments, the silicon substrate can be cleaned, polished, planarized and/or thinned or otherwise processed. In an embodiment, the semiconductor substrate 210 can be single-crystalline or a multi-crystalline silicon substrate. In an embodiment, the silicon substrate can be an N-type or a P-type silicon substrate. In an example, the semiconductor substrate can be a monocrystalline silicon substrate, such as a bulk single crystalline N-type doped semiconductor substrate. It is to be understood, however, that substrate 210 may be a layer, such as a multi-crystalline silicon layer, disposed on a global solar cell substrate. In an embodiment, the substrate 210 can have a front side 202 and a back side 204, where the front side 202 is opposite the back side 204. In one embodiment, the front side 202 can be referred to as a light receiving surface 202 and the back side 204 can be referred to as a back surface 204. In an embodiment, the substrate can be referred to as a semiconductor substrate 210.

Referring to FIG. 2, in an embodiment, the first dopant layer 208 can be formed in a deposition process. In an example, a chemical vapor deposition process can be used to deposit the first dopant layer 208. In one example, forming the first dopant layer 208 can include depositing boron or phosphorus.

With reference to FIG. 3, in an embodiment, the dopant layer 208 of FIG. 2 can be patterned to form a first dopant region 209, according to some embodiments. In one embodiment, patterning the first dopant layer of FIG. 2 can include a lithographic or screen print masking process. In one example, a masking process followed by a subsequent etching process can be performed to pattern the first dopant layer 208. In an embodiment, the first dopant region 209 can be formed over a first portion 216 of the back surface 204 of the semiconductor substrate 210. In an embodiment, the first dopant region 209 can include a dopant such as boron or phosphorus. In an embodiment, an undoped dielectric can be formed over the first dopant region 209. In an example, forming the first dopant region can include depositing an undoped dielectric over the first dopant region 209. In one example, the undoped dielectric disposed over the first dopant region 209 can inhibit dopants from being driven into the first dopant region 209 (e.g., from a second dopant region deposited above the first dopant region 209). In one embodiment, the patterning can form an exposed region 214 of the semiconductor substrate 210, where the exposed region 214 is formed over a second portion 218 of the back surface 204 of the semiconductor substrate 210. In an embodiment, a laser ablation process (e.g., direct write) can be used to pattern the first dopant layer 208 of FIG. 2.

Referring to FIG. 4, in an embodiment, a heating process can be performed to form a first doped region 217 in the semiconductor substrate 210, according to some embodiments. In one embodiment, the heating 220 can drive dopants from a first dopant layer 208 into the first portion 216 of the back surface 204, e.g., referring to FIGS. 2 and 3, of the semiconductor substrate 210. In an embodiment, the heating can include performing a thermal process (e.g., heating the semiconductor substrate in an oven). In some embodiments, the heating at FIG. 4 is optional and need not be performed.

Although FIGS. 2-4 show an exemplary method of forming the first doped region 217, other methods and/or processes may be performed. In an example, the first dopant region 209 can be deposited as a pattern directly, e.g., in contrast to preforming a masking, and subsequent etch process, as shown in FIGS. 2 and 3.

Figure 5:
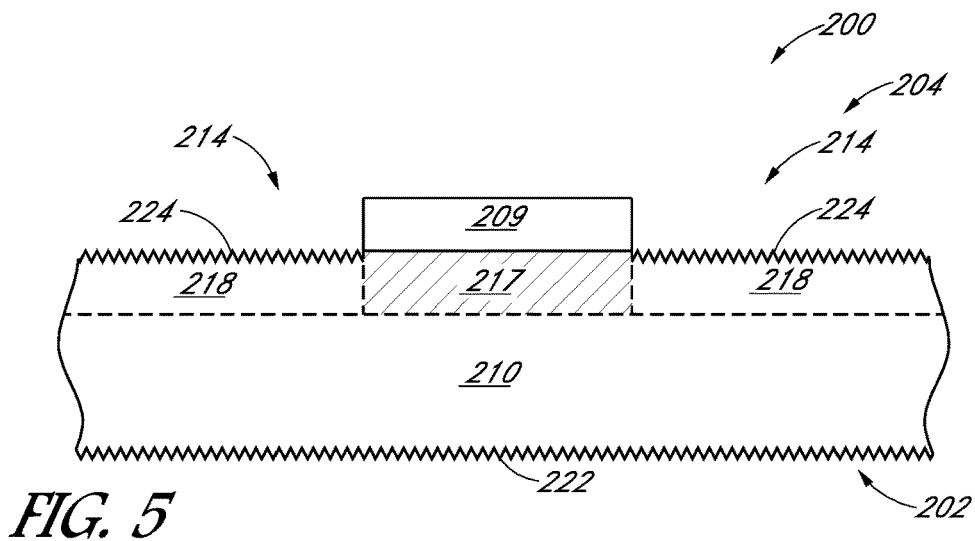

With reference to FIG. 5 and corresponding operation 104 of flowchart 100, the exposed region 214 on the back surface 204 of the semiconductor substrate 210 can be texturized 224, according to some embodiments. In an embodiment, a texturized surface 224 can be formed over a second portion 218 of the back surface 204 of the semiconductor substrate 210. In an example, a texturizing process can be performed to form the texturized surface 224. In an embodiment, a hydroxide-based wet etchant can be used to form at least a portion of the texturized surface 224 and/or to texturize the exposed portions 214 of the semiconductor substrate 210. A texturized surface may be one which has a regular or an irregular shaped surface for scattering incoming light, decreasing the amount of light reflected off of the light-receiving and/or exposed surfaces of the solar cell 200. In a same or similar process, a light receiving surface (e.g., 212 of FIGS. 3 and 4) of the substrate 210 can also be texturized 222, as is depicted in FIG. 5. It is to be appreciated, however, that the texturizing of the back surface 224 and may be omitted from the process flow. In an example, the exposed region 214 of FIGS. 3 and 4 need not be texturized.

Figure 6:
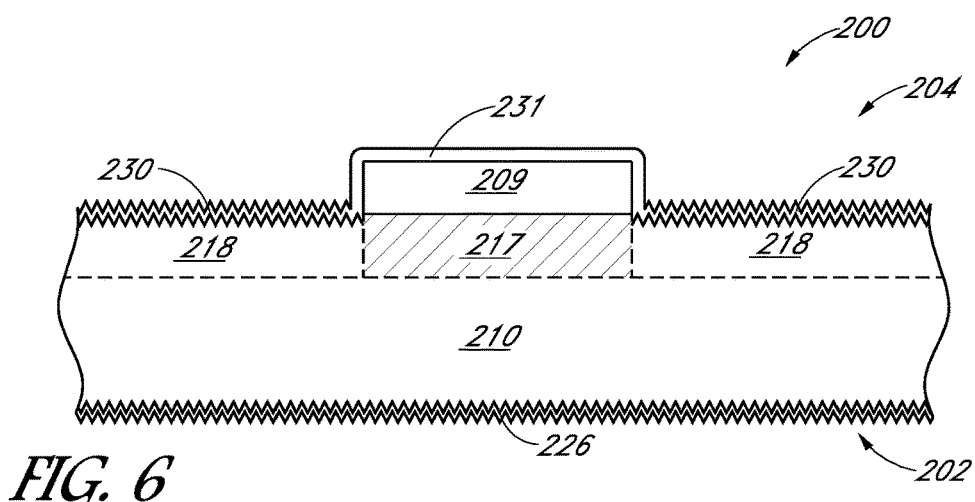

Referring to FIG. 6 and corresponding operation 106 of flowchart 100, a first thin dielectric layer 230 can be formed on the back surface 204 of the semiconductor substrate 210, according to some embodiments. In an embodiment, the first thin dielectric layer 230 can be formed in an oxidation process and is a thin oxide layer such as a tunnel dielectric layer (e.g., silicon oxide). In one embodiment, the first thin dielectric layer 230 can be formed in a deposition process. In an embodiment, the first thin dielectric layer 230 is a thin oxide layer or silicon oxynitride layer. In an embodiment, the first thin dielectric layer 230 can have a thickness of approximately 2 nanometers or less. In an embodiment, a portion 231 of the first thin dielectric layer 230 can be formed over the first doped region 217. In one embodiment, the first thin dielectric layer 230 can be conformal with the texturized surface, e.g., 224 of FIG. 4, as is depicted in FIG. 6. In an embodiment, corresponding second thin dielectric layer 226 can be formed on the light-receiving surface 204 of the semiconductor substrate 210, in the same or similar process operations used to form the first thin dielectric layer 230 as is depicted in FIG. 6. In an embodiment, the second thin dielectric layer 226 can be conformal with the texturized surface, e.g., 222 of FIG. 4, as is depicted in FIG. 6. In an embodiment, the second thin dielectric layer 226 be a tunnel dielectric layer (e.g., silicon oxide).

Figure 7:
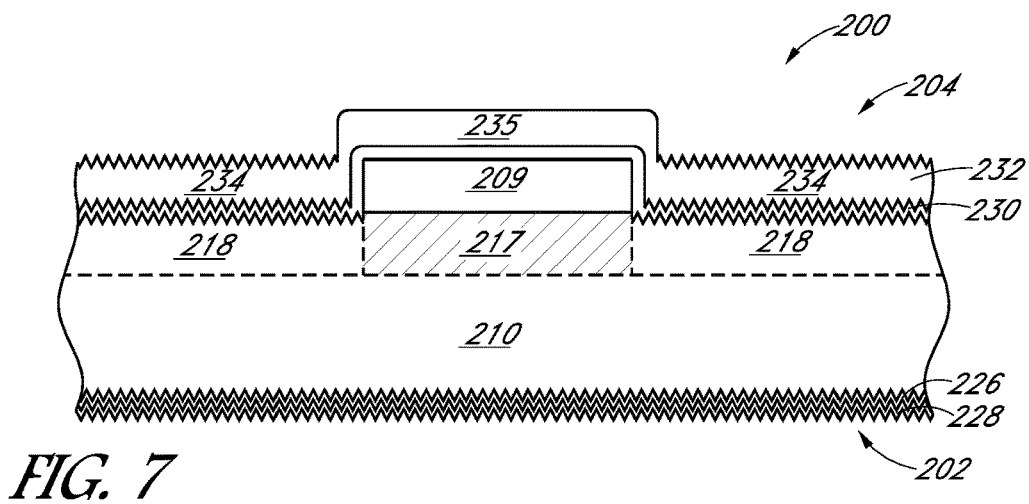

With reference to FIG. 7 and corresponding operation 108 of the flowchart 100, a first semiconductor layer 232 can be formed over the first thin dielectric layer 230. In an embodiment, a portion 235 of the first semiconductor layer 232 can be formed over the first doped region 217. In an embodiment, the first semiconductor layer 232 can be a polycrystalline silicon layer. In one example, polysilicon layer, e.g., first semiconductor layer 232, can be formed over the first thin dielectric layer 230. In one embodiment, the first semiconductor layer 232 (e.g., a polycrystalline silicon layer) is doped to have a conductivity type (e.g., P-type or N-type conductivity) either through in situ doping, post deposition implanting, or a combination thereof. In an example, the first semiconductor layer 232 can be an N-type polysilicon layer formed using an in situ doping process. In another embodiment, the first semiconductor layer 232 can be an amorphous silicon layer such as a hydrogenated silicon layer represented by a-Si:H which is implanted with dopants of a conductivity type (e.g., N-type or P-type conductivity) subsequent to deposition of the amorphous silicon layer. In an embodiment, for either a polycrystalline silicon layer or an amorphous silicon layer, if post deposition implantation can be performed, the implanting is performed by using ion beam implantation or plasma immersion implantation. In one such embodiment, a shadow mask can be used for the implanting. In a specific embodiment, the conductivity type of the first semiconductor layer can be N-type (e.g., formed using phosphorus impurity atoms).

In an embodiment, corresponding second semiconductor layer 228 can be formed on the light-receiving surface 202 of the semiconductor substrate 210, in the same or similar process operations used to form the first semiconductor layer 232 as is depicted in FIG. 7. In one embodiment, the second semiconductor layer 228 can be a polycrystalline silicon layer or an amorphous silicon layer. In an example, the second semiconductor layer 228 can be a polysilicon layer.

Additionally, although not depicted, an anti-reflective (ARC) layer may be formed over the front side 202 and/or back side 204 of the solar cell 200. In an example, a back anti-reflective coating (BARC) layer, such as a layer of silicon nitride, can be formed on the first semiconductor layer 232. In a similar example, an anti-reflective coating (ARC) layer, such as a layer of silicon nitride, can be disposed over the front side 202 of the solar cell. In some embodiments, the first semiconductor layer 232 can be back anti-reflective coating (BARC) layer.

Figure 8:
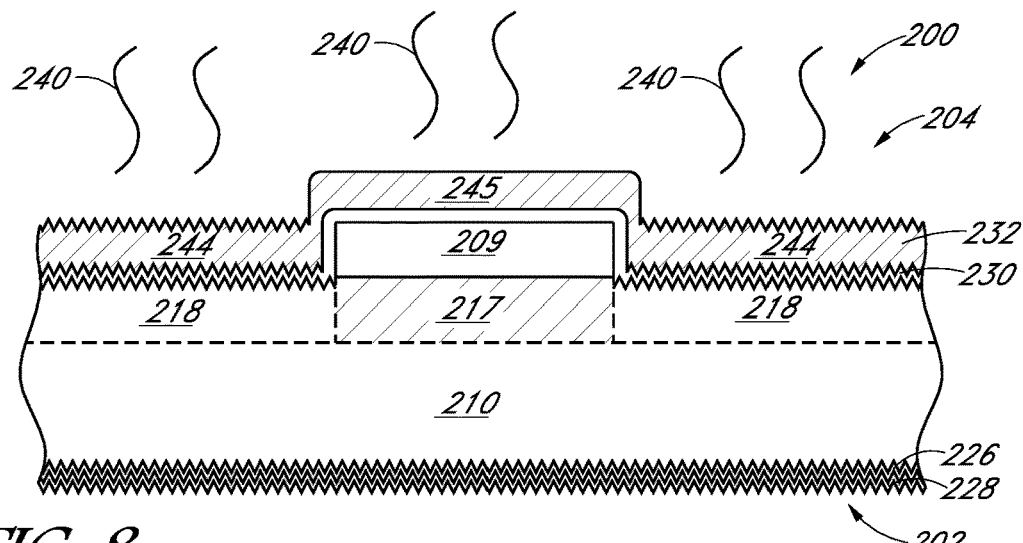

Referring to FIG. 8 and corresponding operation 110 of the flowchart 100, a second doped region 244 of a second conductivity type can be formed in the first semiconductor layer 232, according to some embodiments. In an embodiment, a heating process 240 can be performed to form the second doped region 244 in the first semiconductor layer 232. In one such embodiment, the first semiconductor layer 232 can be subsequently annealed to form a polycrystalline silicon layer. In an example, the first semiconductor layer 232 of FIG. 7 can be an amorphous silicon layer, and after a subsequent annealing process, can form a polycrystalline silicon layer. In a specific embodiment, the second conductivity type (e.g., of the second doped region 244) can be N-type. In an example, the polycrystalline silicon layer is doped to have a second conductivity type either through in situ doping, post deposition implanting, or a combination thereof. In one embodiment, the second doped region 244 of a second conductivity type can be formed over a second portion 218 of the semiconductor substrate 210. In another embodiment (not shown), a second dopant layer (e.g., including phosphorus) can be formed over the first semiconductor layer 232 and the heating 240 can drive dopants from a second dopant layer into the first semiconductor layer 232 to form the second doped region 244 of a second conductivity type. In an embodiment, the heating 240 can include performing a thermal process (e.g., heating the semiconductor substrate in an oven). Subsequent to the heating and/or doping, in an embodiment, a portion 245 of the first semiconductor layer 232 can be formed over the first doped region 217.

In one embodiment, the second doped region 244 is doped to have a conductivity type (e.g., P-type or N-type conductivity) either using a situ doping process, post deposition implanting, or a combination thereof. In an example, the first semiconductor layer 232 and/or the second doped region 244 can be a N-type polysilicon formed using an in situ doping process.

Although, as shown, the heating step of FIG. 4 and FIG. 8 are separate, in another embodiment, a same heating step can be used to form the first and second doped regions 217, 244. In an example, the heating 220 of FIG. 4 need not be performed and the heating 240 of FIG. 8 can instead drive dopants from a first dopant region 209 into a first portion (e.g., 216 of FIGS. 2-4) to form the first doped region 217 and also heat the first semiconductor layer 232 to form the second doped region 244 (e.g., heating an amorphous silicon layer to form a polysilicon layer).

Figure 9:
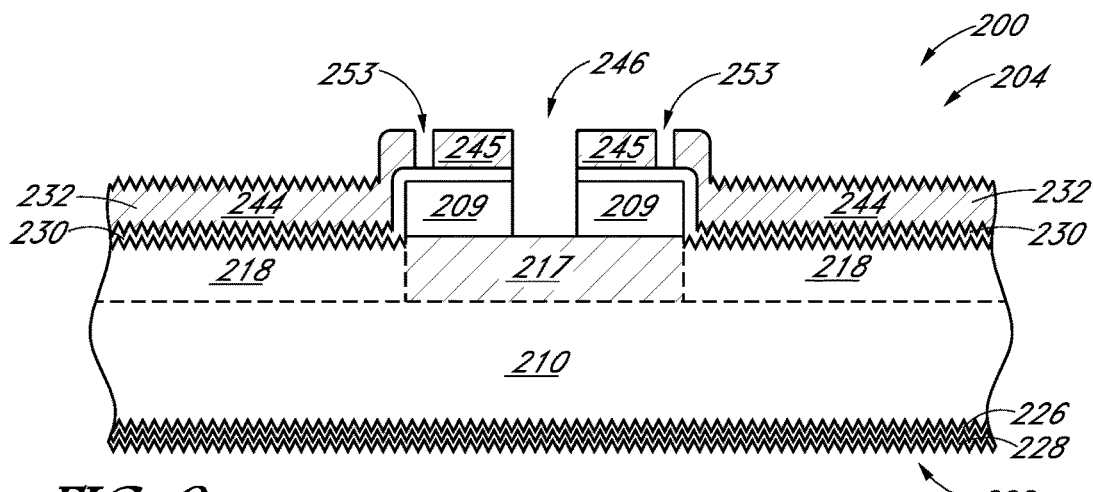

With reference to FIG. 9 and corresponding operation 112 of the flowchart 100, a contact opening can be formed over the first doped region 217, according to some embodiments. In an embodiment, the contact opening 216 can be formed through the first dopant region 209 as shown and, as a result, a first conductive contact 250 (e.g., shown in FIG. 10) can be formed within the contact opening 246. In an example, the contact opening 246 can be formed by laser ablation and/or by a mask and etch process, among other processes. In an embodiment, the contact opening 246 allows for an electrical connection between a conductive contact (250 of FIG. 10 below) and the first doped region 217. In one example, a laser can be used to ablate a portion 245 of the first semiconductor layer 244, and subsequently, a wet chemical etch process can be performed to remove portions of the first thin dielectric layer 230 and the first dopant region 209 to form the contact opening 246.

In an embodiment, a separation region 253 can be formed through a portion 245 of the semiconductor layer 232 over the first doped region 217, according to some embodiments. In an example, the separation region 253 can be formed by laser ablation and/or by a mask and etch process, among other processes. In an embodiment, the separation region 253 allows for an electrical insulation and/or separation between a conductive contact (250 of FIG. 10 below) and the second doped region 244. In one example, a laser can be used to ablate a portion 245 of the first semiconductor layer 244, and subsequently, a wet chemical etch process can be performed to remove portions of the semiconductor layer 232 to form the separation region 253. In some embodiments, the separation region 253 and the contact opening 246 can be formed in a same process step, e.g., a same laser ablation and/or by a mask and etch process step. In an embodiment, forming the separation region 253 is optional, where the separation region 253 need not be formed.

Figure 10:
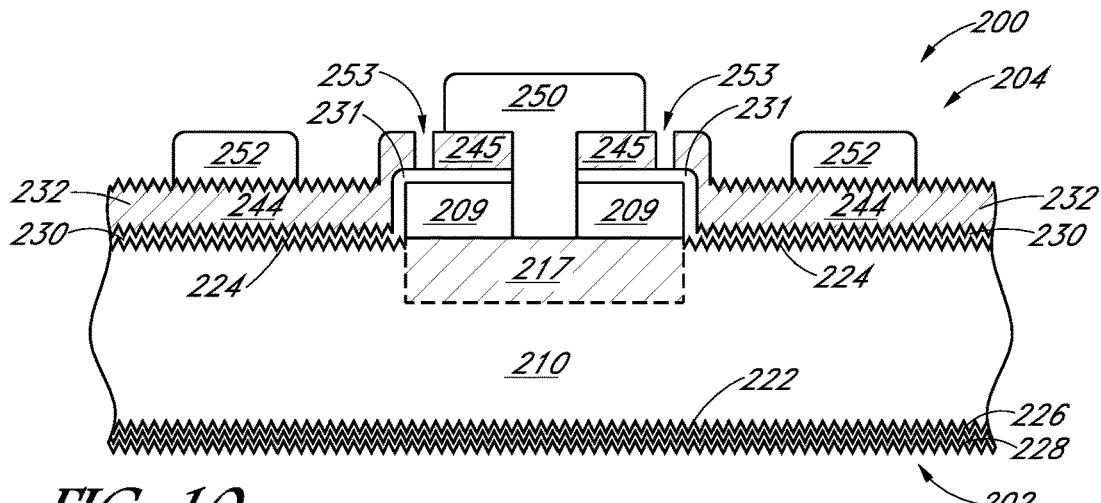
FIG. 10 illustrates a cross-sectional view of an example solar cell formed from the methods of FIGS. 1-9, according to some embodiments.

With reference to FIG. 10 and corresponding operation 114 of flowchart 100, a first conductive contact 250 can be formed over the first doped region 217 and a second conductive contact 252 can be formed over the second doped region 244. In an embodiment, forming the first and second conductive contacts 250, 252 can include performing one or more metallization processes. In an example, forming the first and second conductive contacts 250, 252 can include forming a metal seed layer, plating another metal layer over the metal seed layer and performing a mask and etch process to isolate the first conductive contact 250 from the second conductive contact 252. In an embodiment, a metal seed layer can be a deposited and/or a printed metal layer. In one example, the metal seed layer can be a metal layer deposited on the semiconductor substrate 210 by a physical vapor deposition process or a thermal evaporation process. In one example, forming the first and second conductive contacts 250, 252 can include placing a conductive foil over a metal seed layer, bonding the conductive foil to the metal seed layer and isolating (e.g., via a laser ablation process) the first conductive contact 250 from the second conductive contact 252. In an example, aluminum (e.g., aluminum foil) can be placed over the metal seed layer. In an embodiment, placing the conductive foil over the metal seed layer can include performing compression process to place the conductive foil onto the metal seed layer. In some embodiments, a metal seed layer need not be formed, where the conductive foil can be placed directly on a first and second doped regions 217, 244. In an embodiment, the first and second conductive contacts 250, 252 can include aluminum (e.g., an aluminum region), aluminum/Si, nickel, copper, titanium, tungsten, and/or alloys thereof, among other examples. In an example, the first and second conductive contacts 250, 252 can be formed by blanket deposition, by printing techniques (e.g., screen printing, ink-jet printing and/or spin coating), plating, thermocompression, among other metallization techniques.

In an example, FIG. 10 illustrates a cross-sectional view of a solar cell 200 formed from the methods of FIGS. 1-9, according to some embodiments. In an embodiment, the solar cell 200 can include a semiconductor substrate 210 having a light-receiving surface 202 and a back surface 204. In an embodiment, the semiconductor substrate 210 can be a silicon substrate. In an embodiment, the silicon substrate can be an N-type or a P-type silicon substrate. In an example, the semiconductor substrate 210 can be a monocrystalline silicon substrate, such as a bulk single crystalline N-type doped semiconductor substrate. In one embodiment, a first doped region 217 of a first conductivity type can be disposed in a portion of the semiconductor substrate 210. In a specific embodiment, the first conductivity type is P-type (e.g., formed using boron impurity atoms). In one embodiment, a first thin dielectric layer 230, is disposed over the back surface 204 of the semiconductor substrate 210, where a portion 231 of the first thin dielectric layer 230 is disposed over the first doped region 217 of the first conductivity type. In an example, the first thin dielectric layer can be a tunnel oxide. In an embodiment, a first semiconductor layer 232 is disposed over the first thin dielectric layer 230, where a portion 245 of the first semiconductor layer 244 is disposed over the first doped region 217. In one embodiment, the first semiconductor layer 232 can be a polycrystalline silicon layer or an amorphous silicon layer. In an example, the first semiconductor layer includes polysilicon. In an embodiment, a second doped region 244 of a second, different, conductivity type can be disposed in the second semiconductor layer 242, where the second doped region 244 is disposed over a second portion 218 of the semiconductor substrate 210. In a specific embodiment, the second conductivity type is N-type (e.g., formed using phosphorus atoms). In an embodiment, the first conductivity can be positive and the second conductivity can be negative. In one embodiment, the first conductivity can be P-type and the second conductivity can be N-type. In an embodiment, a first conductive contact 250 is disposed over the first doped region 217. In an embodiment, a contact opening (e.g., contact opening 246 shown in FIG. 9) can allow for an electrical connection between the first conductive contact 250 and the first doped region 217. In an embodiment, a separation region 253 can allow for an electrical insulation and/or separation between first conductive contact 250 and the second doped region 244. In one embodiment, the separation region 253 is optional, where the separation region 253 need not be formed. In an embodiment, the first and second conductive contacts 250, 252 can include a plated metal. In one example, the first and second conductive contacts 250, 252 can include copper, tin, and nickel, among other metals. In some embodiments, the first and second conductive contacts 250, 252 can include a conductive foil. In an example, the first and second conductive contacts 250, 252 can include aluminum or aluminum foil.

In an embodiment, a texturized region 224 can be disposed over the back surface 204 of the semiconductor substrate. In one embodiment, the texturized region 224 can be disposed on the second portion 218 of the back surface 204 of the semiconductor substrate 210. A texturized surface may be one which has a regular or an irregular shaped surface for scattering incoming light, decreasing the amount of light reflected off of the light-receiving and/or exposed surfaces of the solar cell 200. In a same or similar process, a light receiving surface 202 of the substrate 210 can also be texturized 222, as is depicted in FIG. 5.

In an embodiment, corresponding second thin dielectric layer 226 can be disposed on the light-receiving surface 204 of the semiconductor substrate 210. In an example, the second thin dielectric layer 226 can be a tunnel oxide. In an embodiment, corresponding second semiconductor layer 228 can be formed on the light-receiving surface 202 of the semiconductor substrate 210, in the same or similar process operations used to form the first semiconductor layer 232 as is depicted in FIG. 7. In one embodiment, the second semiconductor layer 228 can be a polycrystalline silicon layer or an amorphous silicon layer. In an example, the second semiconductor layer 228 includes polysilicon.

Although not depicted, an anti-reflective (ARC) layer may be formed over the front side 202 and/or back side 204 of the solar cell 200. In an example, a back anti-reflective coating (BARC) layer, such as a layer of silicon nitride, can be formed on the first semiconductor layer 232. In a similar example, an anti-reflective coating (ARC) layer, such as a layer of silicon nitride, can be disposed over the front side 202 of the solar cell.

Methods of fabricating solar cell emitter regions with differentiated P-type and N-type regions architectures, and resulting solar cells, are described. In an example, a solar cell can include a substrate having a light-receiving surface and a back surface. The solar cell can include a first doped region of a first conductivity type, wherein the first doped region is in a first portion of the back surface. In an example, the solar cell can include a first thin dielectric layer disposed over the back surface of the substrate, wherein a portion of the first thin dielectric layer is disposed over the first doped region of the first conductivity type. In the solar cell can include a first semiconductor layer disposed over the first thin dielectric layer. The solar cell can include a second doped region of a second conductivity type in the first semiconductor layer, wherein the second doped region is disposed over a second portion of the back surface. Also, the solar call can include a first conductive contact disposed over the first doped region and a second conductive contact disposed over the second doped region.

A method of fabricating a solar cell can include forming a first doped region of a first conductivity type in a first portion of the back surface of a substrate. The method can include forming a first thin dielectric layer over the back surface of the substrate, wherein a portion of the first thin dielectric layer is formed over the first doped region of the first conductivity type. The method can also include forming a first semiconductor layer over the first thin dielectric layer. The method can include forming a second doped region of a second conductivity type in the first semiconductor layer, wherein the second doped region is formed over a second portion of the back surface of the substrate. The method can include forming a first conductive contact over the first doped region and forming a second conductive contact over the second doped region.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell comprising:
   a substrate having a light-receiving surface and a back surface, wherein the substrate comprises a first portion and a second portion at the back surface of the substrate, and the first portion includes a first doped region of a first conductivity type;
   a layer comprising a dopant over the first doped region;
   a first insulator layer over the back surface of the substrate, wherein a first portion of the first insulator layer is over the layer comprising the dopant and the first doped region of the first conductivity type, and wherein a second portion of the first insulator layer is on the second portion of the substrate;
   a first layer comprising silicon on the first insulator layer, wherein a first portion of the first layer comprising silicon is over the first portion of the first insulator layer, and wherein a second portion of the first layer comprising silicon is a second doped region of a second conductivity type that is over the second portion of the first insulator layer, such that the first doped region is formed in the first portion of the substrate at the back surface and the second doped region is formed over the second portion of the back surface of the substrate, wherein the second doped region is not laterally overlapping with the first doped region, and wherein a bottommost surface of the second doped region is vertically spaced apart from an uppermost surface of the first doped region;
   a first conductive contact over the first doped region; and
   a second conductive contact over the second doped region.

2. The solar cell of claim 1, wherein the substrate comprises a monocrystalline silicon substrate.

3. The solar cell of claim 1, wherein the first conductivity type is P-type and the second conductivity type is N-type.

4. The solar cell of claim 1, wherein the first insulator layer comprises a tunnel oxide.

5. The solar cell of claim 1, further comprising a contact opening between the first doped region and the first conductive contact, wherein the contact opening allows for an electrical connection between the first doped region and the first conductive contact.

6. The solar cell of claim 1, wherein the first layer comprising silicon comprises polysilicon.

7. The solar cell of claim 1, further comprising a second layer comprising silicon on the light-receiving surface.

8. The solar cell of claim 7, wherein the second layer comprising silicon comprises polysilicon.

9. A solar cell comprising:
- a substrate having a light-receiving surface and a back surface, wherein the substrate comprises a first portion and a second portion at the back surface of the substrate and the first portion includes a first doped region of a first conductivity type;
- a layer comprising a dopant over the first doped region;
- a first insulator layer over the back surface of the substrate, wherein a first portion of the first insulator layer is over the layer comprising the dopant and the first doped region of the first conductivity type, and wherein a second portion of the first insulator layer is on the second portion of the substrate;
- a first layer comprising silicon over the first insulator layer, the first layer comprising silicon comprising a first portion and a second portion, and the first portion of the first layer comprising silicon over the first portion of the first insulator layer, wherein a second portion of the first layer comprising silicon is a second doped region of a second conductivity type that is over the second portion of the of the first insulator layer and that is separate from the first portion of the first layer comprising silicon, such that the first doped region is formed in the first portion of the substrate at the back surface and the second doped region is formed over the second portion of the back surface of the substrate, wherein the second doped region is not laterally overlapping with the first doped region, and wherein a bottommost surface of the second doped region is vertically spaced apart from an uppermost surface of the first doped region;
- a first conductive contact over the first doped region; and
- a second conductive contact over the second doped region.

10. The solar cell of claim 9, wherein the substrate comprises a monocrystalline silicon substrate.

11. The solar cell of claim 9, wherein the first conductivity type is P-type and the second conductivity type is N-type.

12. The solar cell of claim 9, wherein the first insulator layer comprises a tunnel oxide.

13. The solar cell of claim 9, further comprising a contact opening between the first doped region and the first conductive contact, wherein the contact opening allows for an electrical connection between the first doped region and the first conductive contact.

14. The solar cell of claim 9, wherein the first layer comprising silicon comprises polysilicon.

15. The solar cell of claim 9, further comprising a second layer comprising silicon on the light-receiving surface.

16. The solar cell of claim 15, wherein the second layer comprising silicon comprises polysilicon.

* * * * *